United States Patent
Shirochi

(10) Patent No.: US 11,964,329 B2
(45) Date of Patent: Apr. 23, 2024

(54) COATED CUTTING TOOL

(71) Applicant: TUNGALOY CORPORATION, Fukushima (JP)

(72) Inventor: Tsukasa Shirochi, Iwaki (JP)

(73) Assignee: TUNGALOY CORPORATION, Fukushima (JP)

(*) Notice: Subject to any disclaimer, the term of this patent is extended or adjusted under 35 U.S.C. 154(b) by 73 days.

(21) Appl. No.: 17/581,619

(22) Filed: Jan. 21, 2022

(65) Prior Publication Data
US 2022/0274892 A1   Sep. 1, 2022

(30) Foreign Application Priority Data

Feb. 26, 2021   (JP) ................. 2021-029792

(51) Int. Cl.
| | |
|---|---|
| B23B 27/14 | (2006.01) |
| B23C 5/16 | (2006.01) |
| C04B 35/56 | (2006.01) |
| C04B 41/50 | (2006.01) |
| C04B 41/52 | (2006.01) |
| C23C 16/32 | (2006.01) |
| C23C 16/34 | (2006.01) |

(Continued)

(52) U.S. Cl.
CPC .......... *B23B 27/148* (2013.01); *B23C 5/16* (2013.01); *C04B 35/5626* (2013.01); *C04B 41/5031* (2013.01); *C04B 41/5061* (2013.01); *C04B 41/5068* (2013.01); *C04B 41/522* (2013.01); *C23C 16/32* (2013.01); *C23C 16/34* (2013.01); *C23C 16/36* (2013.01); *C23C 16/403* (2013.01); *B23B 2228/105* (2013.01); *C04B 2235/3847* (2013.01); *C04B 2235/405* (2013.01)

(58) Field of Classification Search
None
See application file for complete search history.

(56) References Cited

U.S. PATENT DOCUMENTS

| | | |
|---|---|---|
| 2014/0193622 A1 | 7/2014 | Stiens et al. |
| 2016/0298232 A1* | 10/2016 | Kang .................... C23C 28/048 |

(Continued)

FOREIGN PATENT DOCUMENTS

| | | |
|---|---|---|
| CN | 106536100 A | 3/2017 |
| CN | 109952169 A | 6/2019 |

(Continued)

*Primary Examiner* — Humera N. Sheikh
*Assistant Examiner* — Elizabeth D Ivey
(74) *Attorney, Agent, or Firm* — Studebaker & Brackett PC

(57) ABSTRACT

A coated cutting tool comprising: a substrate and a coating layer, wherein the coating layer includes a lower layer and an upper layer; the lower layer includes one or two or more specific Ti compound layers; the upper layer includes an α-type $Al_2O_3$ layer; an average thickness of the lower layer is 2.0 μm to 15.0 μm; an average thickness of the upper layer is 3.5 μm to 15.0 μm; in the upper layer, a ratio of a length of Σ3 grain boundaries to a total length of 100% of a total grain boundary is more than 50% and 80% or less, and a ratio of the length of Σ3 grain boundaries to a total length of 100% of CSL grain boundaries is 70% or more; and in the upper layer, a texture coefficient TC(0,0,12) of the α-type $Al_2O_3$ layer is 8.0 or more and 8.9 or less.

20 Claims, 1 Drawing Sheet

(51) Int. Cl.
    *C23C 16/36*      (2006.01)
    *C23C 16/40*      (2006.01)

(56)              References Cited

U.S. PATENT DOCUMENTS

| | | |
|---|---|---|
| 2017/0087641 A1 | 3/2017 | Okude et al. |
| 2017/0189967 A1 | 7/2017 | Paseuth et al. |
| 2017/0189968 A1 | 7/2017 | Paseuth et al. |
| 2018/0304376 A1 | 10/2018 | Kawahara |
| 2019/0262906 A1 | 8/2019 | Satoh et al. |
| 2020/0038964 A1* | 2/2020 | Satoh .................... C23C 30/005 |
| 2020/0070253 A1 | 3/2020 | Fukushima |

FOREIGN PATENT DOCUMENTS

| | | | |
|---|---|---|---|
| CN | 110871279 A | 3/2020 | |
| EP | 3620552 A1 * | 3/2020 | ............ B23B 27/00 |
| EP | 3620552 A1 | 3/2020 | |
| EP | 3936639 A1 * | 1/2022 | ............ B23B 27/14 |
| JP | 2014-526391 A | 10/2014 | |
| JP | 2015-231662 A | 12/2015 | |
| JP | 2018-183862 A | 11/2018 | |
| WO | 2017/009928 A1 | 1/2017 | |
| WO | WO-2018079229 A1 * | 5/2018 | ............ B23B 27/14 |

\* cited by examiner

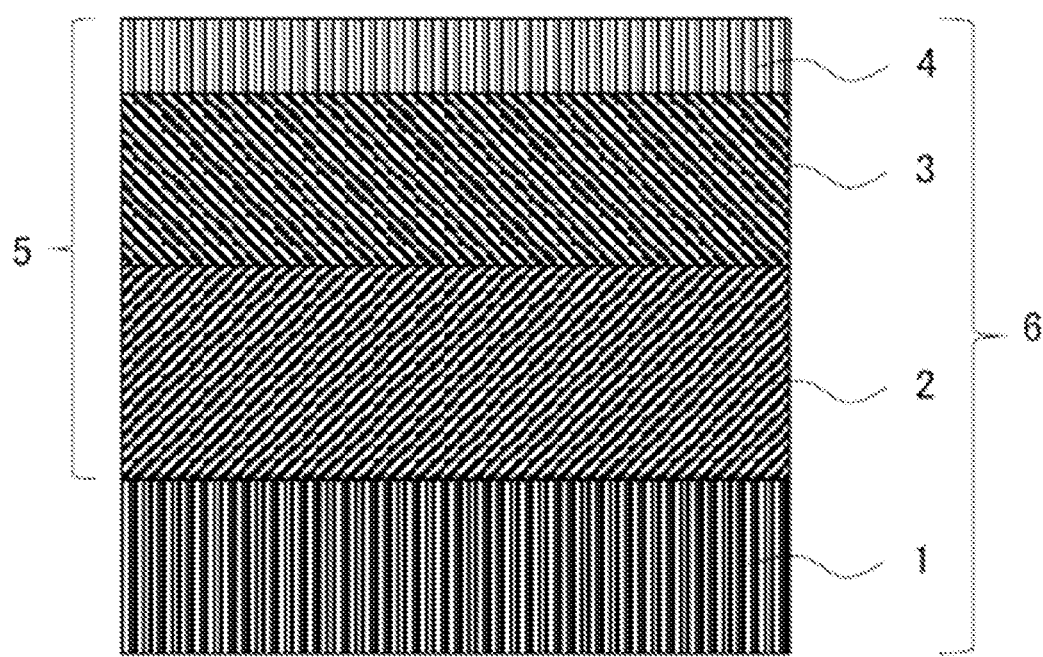

COATED CUTTING TOOL

BACKGROUND OF THE INVENTION

Field of the Invention

The present invention relates to a coated cutting tool.

Description of Related Art

In the related art, it is well known that a coated cutting tool, in which a coating layer is vapor-deposited on a surface of a substrate made of cemented carbide by a chemical vapor deposition method and has a total thickness of 3 μm to 20 μm, is used for cutting steel, cast iron, and the like. As the above-described coating layer, there has been known, for example, a coating layer formed of one type of single layer or two or more types of multiple layers selected from the group consisting of carbides, nitrides, carbonitrides, oxycarbides, and oxycarbonitrides of Ti, and aluminum oxides.

For example, International Patent Application Publication WO 2017/009928 describes a surface-coated cutting tool including a substrate and a coating film formed on the substrate, wherein the coating film includes an α-type $Al_2O_3$ layer, the α-type $Al_2O_3$ layer includes a plurality of α-type $Al_2O_3$ crystal grains and shows (001) orientation, grain boundaries of the crystal grains include CSL grain boundaries and general grain boundaries, and the length of Σ3 type crystal grain boundaries among the CSL grain boundaries is more than 80% of the length of Σ3-29 type grain boundaries, and is 10% or more and 50% or less of a total length of the total grain boundary, which is a sum of the lengths of the Σ3-29 crystal grain boundaries and the lengths of the general grain boundaries.

For example, Japanese Translation of PCT Application No. 2014-526391 describes a cutting tool insert including a substrate formed of a superhard material such as cemented carbide, cermet, ceramics, steel, or cubic boron nitride (CBN) and a coating having a total thickness of 5 μm to 40 μm. The coating includes one or more heat-resistant layers in which at least one layer is an α-Al2O3 layer having a thickness of 1 μm to 20 μm. Here, a length of Σ3-type crystal grain boundaries in the at least one α-Al2O3 layer is more than 80% of a total length of Σ3, Σ7, Σ11, Σ17, Σ19, Σ21, Σ23, and Σ29-type crystal grain boundaries (=Σ3-29-type crystal grain boundaries), and the crystal grain boundary character distribution is measured by EBSD.

SUMMARY

Technical Problem

There has been remarkable increase in speed, feed, and depth of cutting operations in recent years, and further improvement of wear resistance and fracture resistance of coated cutting tools is needed. In particular, in recent years, there has been an increase in the number of cutting operations in which a load is applied to a coated cutting tool, such as high-speed cutting of steel and the cutting temperature increases, and under such severe cutting conditions, crater resistance of the coating layer of the conventional coated cutting tools is insufficient, which results in the occurrence of plastic deformation at an early stage. As a consequence, the tool life is difficult to extend. Further, defects caused by chipping of the coating layer occur, which makes it difficult to extend the tool life.

Meanwhile, in the coated cutting tool in which the α-type $Al_2O_3$ layer of WO 2017/009928 is formed, the ratio of the length of the Σ3 grain boundaries in the total length of the total grain boundary, which is the sum of the CSL grain boundaries and the general grain boundaries, is 50% or less in the α-type $Al_2O_3$ layer, and a certain improvement in mechanical properties has been achieved. However, when the ratio of the length of the Σ3 grain boundaries exceeds 50%, the crystal grains become coarse, so that the chipping resistance of the coated cutting tool becomes insufficient, and thus there is room for improvement.

Further, in the coated cutting tool in which the α-type $Al_2O_3$ layer described in Japanese translation of PCT Application No. 2014-526391 is formed, the ratio of the length of the Σ3 grain boundaries to the total length of the CSL grain boundaries in the α-type $Al_2O_3$ layer exceeds 80%, but the increase in the ratio of the length of the Σ3 grain boundaries to the total length of the total grain boundary, which is the sum of the CSL grain boundaries and the general grain boundaries, has not been studied. Therefore, the coated cutting tool described in Japanese translation of PCT Application No. 2014-526391 has insufficient wear resistance, plastic deformation resistance, and fracture resistance, and there is room for improvement.

The present invention has been made in view of the above circumstances, and an object of the present invention is to provide a coated cutting tool capable of extending the tool life by having excellent wear resistance and fracture resistance.

Solution to Problem

The present inventor has conducted continued research on extending the tool life of a coated cutting tool from the above viewpoint. As a result, it has been found that where a coating layer of a coated cutting tool includes a lower layer including a Ti compound layer and an upper layer including α-type $Al_2O_3$ in this order, and the upper layer satisfies a specific requirement, fracture the upper layer including α-type $Al_2O_3$ can be suppressed. It has been also found that the effect of the upper layer including α-type $Al_2O_3$ is maintained longer than before, so that wear resistance can be improved, and as a result, the tool life of the coated cutting tool can be extended. Thus, the invention has been completed.

That is, the gist of the present invention is as follows.

[1] A coated cutting tool comprising:
a substrate and a coating layer formed on a surface of the substrate, wherein
the coating layer includes a lower layer and an upper layer in this order from the substrate side toward the surface side of the coating layer,
the lower layer includes one or two or more Ti compound layers composed of a Ti compound of Ti and an element of at least one kind selected from the group consisting of C, N and O,
the upper layer includes an α-type $Al_2O_3$ layer composed of α-type $Al_2O_3$,
an average thickness of the lower layer is 2.0 μm or more and 15.0 μm or less,
an average thickness of the upper layer is 3.5 μm or more and 15.0 μm or less,
in the upper layer, a ratio of a length of Σ3 grain boundaries to a total length of 100% of a total grain boundary is more than 50% and 80% or less, and a ratio of the length of Σ3 grain boundaries to a total length of 100% of CSL grain boundaries is 70% or more, and in the upper layer, a texture coefficient TC(0,0,12) of a (0,0,12) plane of the α-type Al$_2$O$_3$ layer represented by a following formula (1) is 8.0 or more and 8.9 or less:

$$TC(0, 0, 12) = \frac{I(0, 0, 12)}{I_0(0, 0, 12)} \left\{ \frac{1}{9} \sum \frac{I(h, k, l)}{I_0(h, k, l)} \right\}^{-1} \quad (1)$$

(in the formula (1), I(h,k,l) is a peak intensity obtained by X-ray diffraction measured on an (h,k,l) plane of the α-type Al$_2$O$_3$ layer, I$_0$(h,k,l) is a standard diffraction intensity of the (h,k,l) plane of α-type Al$_2$O$_3$ according to JCPDS card number 10-0173, and (h,k,l) represents nine crystal planes: (0,1,2), (1,0,4), (1,1,3), (0,2,4), (1,1,6), (2,1,4), (3,0,0), (0,2,10), and (0,0,12)).

[2] The coated cutting tool according to [1], wherein the ratio of the length of the Σ3 grain boundaries to the total length of 100% of the CSL grain boundaries is 80% or more and 99% or less.

[3] The coated cutting tool according to [1] or [2], wherein in the upper layer, a ratio [d$_s$/d$_u$] of an average grain size d$_s$ at a position of 0.5 μm from the surface side of the coating layer toward the lower layer side to an average grain size d$_u$ at a position of 2.5 μm from the lower layer side toward the surface of the coating layer is 1.0 or more and 1.7 or less.

[4] The coated cutting tool according to [3], wherein the d$_u$ is 0.5 μm or more and 1.4 μm or less, and the d$_s$ is 0.6 μm or more and 1.5 μm or less.

[5] The coated cutting tool according to any one of [1] to [4], wherein
the coating layer includes an outer layer on the opposite side of the upper layer to the substrate side,
the outer layer includes a Ti compound layer composed of a Ti compound consisting of Ti and an element of at least one kind selected from the group consisting of C, N and O, and
an average thickness of the outer layer is 0.3 μm or more and 4.0 μm or less.

[6] The coated cutting tool according to any one of [1] to [5], wherein an average thickness of the entire coating layer is 5.5 μm or more and 25.0 μm or less.

[7] The coated cutting tool according to any one of [1] to [6], wherein the Ti compound layer contained in the lower layer is at least one selected from the group consisting of a TiN layer composed of TiN, a TiC layer composed of TiC, a TiCN layer composed of TiCN, a TiCO layer composed of TiCO, and a TiCNO layer composed of TiCNO.

[8] The coated cutting tool according to any one of [1] to [7], wherein the substrate is any of a cemented carbide, a cermet, a ceramic, or a cubic boron nitride sintered body.

Advantageous Effects of Invention

According to the invention, it is possible to provide a coated cutting tool whose tool life can be extended by having excellent wear resistance and fracture resistance.

BRIEF DESCRIPTION OF DRAWINGS

FIGURE is a schematic view showing an example of a coated cutting tool according to the present invention.

DETAILED DESCRIPTION

Hereinafter, a mode for carrying out the present invention (hereinafter, simply referred to as "the present embodiment") will be described in detail with reference to the drawings as necessary, but the present invention is not limited to the present embodiment. The present invention can be modified in various ways without departing from the gist thereof. In the drawings, the positional relationships such as up, down, left, and right are assumed to be based on the positional relationships shown in the drawings unless otherwise specified. Furthermore, the dimensional ratios in the drawings are not limited to the ratios shown.

The coated cutting tool of the present embodiment includes a substrate and a coating layer formed on the surface of the substrate, wherein the coating layer includes a lower layer and an upper layer in this order from the substrate side toward the surface side of the coating layer; the lower layer includes one or two or more Ti compound layers composed of a Ti compound of Ti and an element of at least one kind selected from the group consisting of C, N and O; the upper layer includes an α-type Al$_2$O$_3$ layer composed of α-type Al$_2$O$_3$; an average thickness of the lower layer is 2.0 μm or more and 15.0 μm or less; an average thickness of the upper layer is 3.5 μm or more and 15.0 μm or less; in the upper layer, a ratio of a length of Σ3 grain boundaries to a total length of 100% of the total grain boundary is more than 50% and 80% or less, and a ratio of the length of Σ3 grain boundaries to a total length of 100% of CSL grain boundaries is 70% or more; and in the upper layer, a texture coefficient TC(0,0,12) of a (0,0,12) plane of the α-type Al$_2$O$_3$ layer represented by a following formula (1) is 8.0 or more and 8.9 or less.

$$TC(0, 0, 12) = \frac{I(0, 0, 12)}{I_0(0, 0, 12)} \left\{ \frac{1}{9} \sum \frac{I(h, k, l)}{I_0(h, k, l)} \right\}^{-1} \quad (1)$$

(In the formula (1), I(h,k,l) is a peak intensity obtained by X-ray diffraction measured on an (h,k,l) plane of the α-type Al$_2$O$_3$ layer, I$_0$(h,k,l) is a standard diffraction intensity of the (h,k,l) plane of α-type Al$_2$O$_3$ according to JCPDS card number 10-0173, and (h,k,l) represents nine crystal planes: (0,1,2), (1,0,4), (1,1,3), (0,2,4), (1,1,6), (2,1,4), (3,0,0), (0,2,10), and (0,0,12)).

Since the coated cutting tool of the present embodiment has the above-mentioned configuration, the wear resistance and fracture resistance can be improved, and as a result, the tool life can be extended. Factors for improving the wear resistance and fracture resistance of the coated cutting tool of the present embodiment are considered hereinbelow. However, the present invention is not limited to the following factors. That is, first, the coated cutting tool of the present embodiment includes one layer or two or more Ti compound layers composed of a Ti compound of Ti and an element of at least one kind selected from the group consisting of C, N and O. Where the coated cutting tool of the present embodiment is provided with such a lower layer between the substrate and the upper layer, the wear resistance and adhesion are improved. Further, since the average thickness of the lower layer in the coated cutting tool of the present embodiment is 2.0 μm or more, the wear resistance is improved. Meanwhile, since the average thickness of the lower layer in the coated cutting tool of the present embodiment is 15.0 μm or less, the fracture resistance is improved mainly due to the suppression of the peeling of the coated layer.

Further, since the upper layer of the coated cutting tool of the present embodiment includes an α-type Al$_2$O$_3$ layer composed of α-type Al$_2$O$_3$, the hardness of the coating tool is increased, thereby improving the wear resistance. Further, where the average thickness of the upper layer in the coated cutting tool of the present embodiment is 3.5 μm or more, the crater wear resistance on the rake surface of the coated cutting tool is further improved, and where the average thickness of the upper layer is 15.0 μm or less, the peeling of the coating layer is further suppressed, and the fracture resistance of the coated cutting tool is further improved.

In the coated cutting tool of the present embodiment, where the ratio of the length of the Σ3 grain boundaries to the total length of 100% of the total grain boundary in the upper layer is more than 50%, the ratio of grain boundaries having a relatively low grain boundary energy is increased, so that mechanical properties of the upper layer are improved. Meanwhile, where the ratio of the length of the Σ3 grain boundaries to the total length of 100% of the total grain boundary in the upper layer is 80% or less, the coarsening of crystal grains can be suppressed, so that excellent chipping resistance is achieved. Further, in the coated cutting tool of the present embodiment, where the ratio of the length of the Σ3 grain boundaries to the total length of 100% of the CSL grain boundaries in the upper layer is 70% or more, it shows that the ratio of grain boundaries having a relatively low grain boundary energy is large. Where the grain boundary energy is low in the coated cutting tool of the present embodiment, mechanical properties are improved, so that the crater wear resistance is improved.

In the coated cutting tool of the present embodiment, since the texture coefficient TC(0,0,12) of the (0,0,12) plane of the α-type $Al_2O_3$ layer represented by the formula (1) is 8.0 or more, the ratio of the peak intensity I(0,0,12) on the (0,0,12) plane becomes high. Due to this, crater wear can be suppressed, and as a result, excellent wear resistance is achieved. Meanwhile, in the coated cutting tool of the present embodiment, since the texture coefficient TC(0,0,12) of the (0,0,12) plane of the α-type $Al_2O_3$ layer in the upper layer represented by the formula (1) is 8.9 or less, the cutting tool can be easily manufactured.

It is considered that due to a combination of these features, the coated cutting tool of the present embodiment has improved wear resistance and fracture resistance, and as a result, the tool life can be extended.

FIGURE is a schematic cross-sectional view showing an example of a coated cutting tool of the present embodiment. A coated cutting tool 6 has a substrate 1 and a coating layer 5 formed on the surface of the substrate 1, and in the coating layer 5, a lower layer 2, an upper layer 3 and an outer layer 4 are layered upward in this order (on the surface side of the coating layer from the substrate side).

The coated cutting tool of the present embodiment includes the substrate and the coating layer formed on the surface of the substrate. Specific examples of types of the coated cutting tool include an indexable cutting insert for milling or turning, a drill, and an end mill.

The substrate used in the present embodiment is not particularly limited as long as the substrate can be used as a substrate for a coated cutting tool. Examples of such a substrate include cemented carbide, cermet, ceramics, a cubic boron nitride sintered body, a diamond sintered body, and high speed steel. Among the above, it is preferable the substrate is any one of cemented carbide, cermet, ceramics, and a cubic boron nitride sintered body because the coated cutting tool is more excellent in the wear resistance and the fracture resistance, and from the same viewpoint, it is more preferable that the substrate is cemented carbide.

The surface of the substrate may be modified. For example, when the substrate is made of cemented carbide, a β-free layer may be formed on the surface thereof. Further, when the substrate is made of cermet, a cured layer may be formed on the surface thereof. Even if the surface of the substrate is modified as described above, the effects of the invention can be achieved.

The average thickness of the coating layer used in the present embodiment is preferably 5.5 μm or more and 25.0 μm or less, whereby the wear resistance is improved. In the coated cutting tool of the present embodiment, where the average thickness of the entire coating layer is 5.5 μm or more, the wear resistance is improved, and where the average thickness of the entire coating layer is 25.0 μm or less, the fracture resistance is improved mainly due to the suppression of peeling. From the same viewpoint, the average thickness of the coating layer used in the present embodiment is more preferably 8.0 μm or more and 22.0 μm or less, and further preferably 10.5 μm or more and 21.3 μm or less. The average thickness of each layer or the entire coating layer in the coated cutting tool of the present embodiment is obtained by measuring the thickness of each layer or the thickness of the entire coating layer from three or more cross sections in each layer or the entire coating layer, and calculating an arithmetic mean value.

Lower Layer

The lower layer used in this embodiment includes one or two or more Ti compound layers composed of a Ti compound consisting of Ti and an element of at least one kind selected from the group consisting of C, N and O. Where the coated cutting tool of the present embodiment is provided with such a lower layer between the substrate and the upper layer, the wear resistance and adhesion are improved.

The Ti compound layer contained in the lower layer is not particularly limited, and is, for example, a TiN layer composed of TiN, a TiC layer composed of TiC, a TiCN layer composed of TiCN, a TiCO layer composed of TiCO, a TiCNO layer composed of TiCNO, and a $TiB_2$ layer composed of $TiB_2$.

The lower layer may be configured of one layer or multiple layers (for example, two or three layers), but is preferably configured of multiple layers, more preferably of two or three layers, and even more preferably of three layers. From the viewpoint of further improving the wear resistance and adhesion, the lower layer preferably includes a layer of at least one kind selected from the group consisting of a TiN layer, a TiC layer, a TiCN layer, a TiCO layer and a TiCNO layer. Further, in the coated cutting tool of the present embodiment, where at least one layer of the lower layer is a TiCN layer, the wear resistance tends to be further improved.

Further, in the coated cutting tool of the present embodiment, where at least one layer of the lower layer is a TiN layer, and the TiN layer is formed on the surface of the substrate, the adhesion tends to be further improved. When the lower layer is configured of two layers, a TiC layer or a TiN layer may be formed as a first layer on the surface of the substrate, and a TiCN layer may be formed as a second layer on the surface of the first layer. When the lower layer is configured of three layers, a TiC layer or a TiN layer may be formed as a first layer on the surface of the substrate, a TiCN layer may be formed as a second layer on the surface of the first layer, and a TiCO layer or a TiCNO layer may be formed as a third layer on the surface of the second layer. When the lower layer is configured of three layers, having a TiN layer or a TiC layer on the substrate side (first layer) of the lower layer is preferable because the adhesion between the substrate and the lower layer tends to further improve, and having a TiCO layer or a TiCNO layer on the upper layer side (third layer) of the lower layer is preferable because the adhesion between the lower layer and the upper layer tends to be further improved. Among them, the lower layer may have a TiN layer formed as a first layer on the surface of the substrate, a TiCN layer formed as a second layer on the surface of the first layer, and a TiCNO layer formed as a third layer on the surface of the second layer.

The average thickness of the lower layer used in the present embodiment is 2.0 µm or more and 15.0 µm or less. The coated cutting tool of the present embodiment has improved wear resistance when the average thickness of the lower layer is 2.0 µm or more. Meanwhile, where the average thickness of the lower layer is 15.0 µm or less in the coated cutting tool of the present embodiment, the fracture resistance is improved mainly due to the suppression of the peeling of the coated layer. From the same viewpoint, the average thickness of the lower layer is preferably 2.5 µm or more and 14.5 µm or less, and more preferably 3.2 µm or more and 14.0 µm or less.

In the lower layer, the average thickness of the TiC layer or the TiN layer is preferably 0.05 µm or more and 1.0 µm or less from the viewpoint of further improving the wear resistance and fracture resistance. From the same viewpoint, the average thickness of the TiC layer or the TiN layer is more preferably 0.1 µm or more and 0.5 µm or less, and further preferably 0.2 µm or more and 0.4 µm or less.

In the lower layer, the average thickness of the TiCN layer is preferably 2.0 µm or more and 15.0 µm or less from the viewpoint of further improving the wear resistance and fracture resistance. From the same viewpoint, the average thickness of the TiCN layer is more preferably 2.2 µm or more and 14.0 µm or less, and further preferably 2.5 µm or more and 13.0 µm or less.

In the lower layer, the average thickness of the TiCO layer or the TiCNO layer is preferably 0.1 µm or more and 1.0 µm or less from the viewpoint of further improving the wear resistance and fracture resistance. From the same viewpoint, the average thickness of the TiCN layer is more preferably 0.2 pm or more and 0.8 µm or less, and further preferably 0.4 µm or more and 0.7 pm or less.

The Ti compound layer is composed of a Ti compound of Ti and an element of at least one kind selected from the group consisting of C, N and O, but this layer may include a trace amount of a component other than the above elements as long as the effect of the lower layer is exerted.

Upper Layer

The upper layer used in the present embodiment includes an α-type $Al_2O_3$ layer composed of α-type $Al_2O_3$. Since the upper layer includes the α-type $Al_2O_3$ layer composed of α-type $Al_2O_3$, the hardness of the coated cutting tool of the present embodiment increases, so that the wear resistance is improved.

Further, in the coated cutting tool of the present embodiment, the average thickness of the upper layer is 3.5 µm or more and 15.0 µm or less. Where the average thickness of the upper layer is 3.5 µm or more, the crater wear resistance on the rake surface of the coated cutting tool is further improved. When the average thickness of the upper layer is 15.0 µm or less, the peeling of the coating layer is further suppressed, and the fracture resistance of the coated cutting tool is further improved. From the same viewpoint, the average thickness of the upper layer is preferably 3.5 µm or more and 14.5 µm or less, and more preferably 3.6 µm or more and 14.0 µm or less.

Further, in the coated cutting tool of the present embodiment, the ratio of the length of the Σ3 grain boundaries to the total length of 100% of the total grain boundary is more than 50% and 80% or less in the upper layer. Where the ratio of the length of the Σ3 grain boundaries to the total length of 100% of the total grain boundary in the upper layer exceeds 50%, the ratio of grain boundary having a relatively low grain boundary energy becomes large, so that mechanical properties of the upper layer are improved. Meanwhile, where the ratio of the length of the Σ3 grain boundaries to the total length of 100% of the total grain boundary is 80% or less in the upper layer, the coarsening of crystal grains can be suppressed, so that excellent chipping resistance is achieved. In the present embodiment, the total length of the total grain boundary is the length obtained by adding up the length of the CSL grain boundaries and the length of other general grain boundaries. From the same viewpoint, in the upper layer, the ratio of the length of the Σ3 grain boundaries to the total length of 100% of the total grain boundary is preferably 52% or more and 79% or less, and more preferably 54% or more and 78% or less.

Further, in the coated cutting tool of the present embodiment, the ratio of the length of the Σ3 grain boundaries to the total length of 100% of the CSL grain boundaries in the upper layer is 70% or more, and preferably 70% or more and 99% or less. Where the ratio of the length of the Σ3 grain boundaries to the total length of 100% of the CSL grain boundaries in the upper layer is 70% or more, it indicates that the ratio of crystal grain boundaries having a relatively low grain boundary energy is large. In the coated cutting tool of the present embodiment, where the grain boundary energy is low, mechanical properties are improved, so that the crater wear resistance is improved. Meanwhile, where the ratio of the length of the Σ3 grain boundaries to the total length of 100% of the CSL grain boundaries is 99% or less, the cutting tool tends to be easy to manufacture. From the same viewpoint, the ratio of the length of the Σ3 grain boundaries to the total length of 100% of the CSL grain boundaries in the upper layer is more preferably 75% or more and 99% or less, more preferably 80% or more and 99% or less, and particularly preferably 80% or more and 97% or less.

The upper layer used in the present embodiment has crystal grain boundaries having relatively high grain boundary energy and crystal grain boundaries having relatively low grain boundary energy. Normally, since the arrangement of atoms is irregularly disordered and randomly arranged, the crystal grain boundaries have relatively high grain boundary energy with many gaps. On the other hand, some crystal grain boundaries have regular arrangement of atoms and few gaps, and such crystal grain boundaries have relatively low grain boundary energy. A typical example of a crystal grain boundary having such relatively low grain boundary energy is a coincidence site lattice crystal grain boundary (hereinafter, referred to as a "CSL crystal grain boundary" and also referred to as a "CSL grain boundary"). Crystal grain boundaries have a significant effect on important sintering processes such as densification, creep, and diffusion, as well as on electrical, optical, and mechanical properties. The importance of crystal grain boundaries depends on several factors, such as a crystal grain boundary density in a material, a chemical composition at an interface, and a crystallographic texture, that is, a crystal grain boundary plane orientation and a crystal grain misorientation. The CSL crystal grain boundaries play a special role. An Σ value is known as an index showing a degree of distribution of the CSL crystal grain boundaries, and is defined as a ratio of a crystal lattice point density of two crystal grains that are in contact with each other at a crystal grain boundary to a density of matching lattice points when both crystal lattices are overlapped. For simple structures, it is generally accepted that grain boundaries having a low Σ value tend to have low interfacial energy and special properties. Therefore, controlling of a ratio of the CSL crystal grain boundaries and distribution of crystal grain misorientations is considered to be important for the properties of the upper layer and improvement thereof.

In recent years, SEM-based technology known as electron backscattered diffraction (hereinafter also referred to as "EBSD") has been used to study crystal grain boundaries in a material. EBSD is based on automatic analysis of Kikuchi diffraction patterns generated by backscattered electrons.

For each crystal grain of a target material, a crystallographic orientation is determined after indexing the corresponding diffraction pattern. By using EBSD together with commercially available software, tissue analysis and determination of grain boundary character distribution (GBCD) can be performed relatively easily. By measuring and analyzing the interface using EBSD, it is possible to clarify the misorientations of the crystal grain boundaries in a sample population having a large interface. Usually, the distribution of the misorientations is related to the treatment and/or physical properties of the material. The misorientations of the crystal grain boundaries are obtained from normal orientation parameters such as an Euler angle, an angle/axis pair, or a Rodriguez vector.

In the present embodiment, the CSL grain boundaries of the upper layer indicate Σ3 grain boundaries and also Σ7 grain boundaries, Σ11 grain boundaries, Σ13 grain boundaries, Σ17 grain boundaries, Σ19 grain boundaries, Σ21 grain boundaries, Σ23 grain boundaries, and Σ29 grain boundaries. The Σ3 grain boundaries are considered to have the lowest grain boundary energy among the CSL crystal grain boundaries of the upper layer. Here, the length of the Σ3 grain boundaries indicates the total length of the Σ3 grain boundaries in a field of view (specific region) observed by an SEM equipped with EBSD. The Σ3 grain boundaries have a higher coincidence site lattice point density and lower grain boundary energy than those of other CSL crystal grain boundaries. In other words, the Σ3 grain boundaries are CSL crystal grain boundaries having many matching lattice points, and two crystal grains having the Σ3 grain boundaries as the grain boundaries behave like single crystals or twin crystals, and the crystal grains tend to be large. In the coated cutting tool of the present embodiment, the crater wear resistance is improved by increasing the ratio of the length of the Σ3 grain boundaries to the total length of 100% of the CSL crystal grain boundaries in the upper layer.

Here, the total grain boundary is a sum of the CSL crystal grain boundaries and the crystal grain boundaries other than the CSL crystal grain boundaries. Hereinafter, the grain boundaries other than the CSL crystal grain boundaries are referred to as "general crystal grain boundaries". The general crystal grain boundaries are remaining grain boundaries excluding the CSL crystal grain boundaries from the total grain boundary of the crystal grains in the upper layer when observed with an SEM equipped with EBSD. Therefore, the "total length of the total grain boundary" can be expressed as the "sum of the length of the CSL crystal grain boundaries and the length of the general crystal grain boundaries".

In the present embodiment, the ratio of the length of the Σ3 grain boundaries to the total length of 100% of the total grain boundary in the upper layer and the ratio of the length of the Σ3 grain boundaries to the total length of 100% of the CSL grain boundaries can be calculated in the following manner.

In a coated cutting tool, a cross section of the upper layer is exposed in the direction parallel to the surface of the substrate to obtain an observation surface. Examples of the method for exposing the cross section of the upper layer include cutting and polishing. Of these, polishing is preferable from the viewpoint of making the observation surface of the upper layer smoother. In particular, from the viewpoint of better smoothness, the observation surface is preferably a mirror surface. A method for obtaining the mirror surface observation surface of the upper layer is not particularly limited, and examples thereof include a method of polishing with diamond paste or colloidal silica, ion milling, and the like.

After that, the observation surface is observed by an SEM equipped with EBSD. As the observation region, it is preferable to observe a flat surface (a flank surface or the like).

As the SEM, SU6600 (manufactured by Hitachi High-Technologies Corporation) equipped with EBSD (manufactured by TexSEM Laboratories) is used.

The normal of the observation surface is tilted by 70° with respect to the incident beam, and the analysis is performed by irradiating with an electron beam at an acceleration voltage of 15 kV and an irradiation current of 1.0 nA. Data are collected in steps of 0.05 μm/step for 1000×600 points corresponding to a 50 μm×30 μm surface region of the upper layer on the observation surface. The data are collected for a surface region of 5 visual fields (50 μm×30 μm of the upper layer), and the average value is calculated.

Data processing is performed using commercially available software. It can be confirmed by counting the CSL grain boundaries corresponding to an arbitrary Σ value and expressing the ratio of each grain boundary as a ratio to all the crystal grain boundaries. From the above, the length of the Σ3 grain boundaries, the length of the CSL grain boundaries, and the total length of the total grain boundary can be obtained, and the ratio of the length of the Σ3 grain boundaries to the total length of 100% of the total grain boundary, and the ratio of the length of the Σ3 grain boundaries to the total length of 100% of the CSL grain boundaries can be calculated.

In the coated cutting tool of the present embodiment, in the upper layer, the texture coefficient TC(0,0,12) of the (0,0,12) plane of the α-type $Al_2O_3$ layer represented by the following formula (1) is 8.0 or more and 8.9 or less.

[Math. 3]

$$TC(0, 0, 12) = \frac{I(0, 0, 12)}{I_0(0, 0, 12)} \left\{ \frac{1}{9} \sum \frac{I(h, k, l)}{I_0(h, k, l)} \right\}^{-1} \quad (1)$$

(In the formula (1), I(h,k,l) is a peak intensity obtained by X-ray diffraction measured on an (h,k,l) plane of the α-type $Al_2O_3$ layer, $I_0$(h,k,l) is a standard diffraction intensity of the (h,k,l) plane of α-type $Al_2O_3$ according to JCPDS card number 10-0173, and (h,k,l) represents nine crystal planes: (0,1,2), (1,0,4), (1,1,3), (0,2,4), (1,1,6), (2,1,4), (3,0,0), (0,2,10), and (0,0,12)).

In the coated cutting tool of the present embodiment, because the texture coefficient TC(0,0,12) of the (0,0,12) plane of the α-type $Al_2O_3$ layer represented by the formula (1) is 8.0 or more in the upper layer, the ratio of the peak intensity I(0,0,12) on the (0,0,12) plane becomes high. Therefore, the crater wear can be suppressed, and as a result, excellent wear resistance is achieved. Meanwhile, in the coated cutting tool of the present embodiment, where the texture coefficient TC(0,0,12) of the (0,0,12) plane of the α-type $Al_2O_3$ layer represented by the above formula (1) in the upper layer is 8.9 or less, the cutting tool can be easily manufactured.

From the same viewpoint, the texture coefficient TC(0,0,12) of the (0,0,12) plane of the α-type $Al_2O_3$ layer represented by the above formula (1) is preferably 8.1 or more and 8.8 or less, and more preferably 8.2 or more and 8.8 or less.

In the present embodiment, the texture coefficient TC(0,0,12) of the (0,0,12) plane of the α-type $Al_2O_3$ layer can be determined by the method described in the Examples described hereinbelow.

In the coated cutting tool of the present embodiment, in the upper layer, the ratio $[d_s/d_u]$ of the average grain size $d_s$ at a position of 0.5 μm from the surface side of the coating layer toward the lower layer side to the average grain size $d_u$ at a position of 2.5 μm from the lower layer side toward the surface of the coating layer is 1.0 or more and 1.7 or less.

In the coated cutting tool of the present embodiment, the ratio $[d_s/d_u]$ in the upper layer is preferably 1.0 or more because the cutting tool is easy to manufacture, and where this ratio is 1.7 or less, coarsening of crystal grains in the α-type $Al_2O_3$ layer is suppressed, so that the chipping resistance tends to be improved. From the same viewpoint, in the coated cutting tool of the present embodiment, the ratio $[d_s/d_u]$ in the upper layer is more preferably 1.2 or more and 1.7 or less, and further preferably 1.3 or more and 1.7 or less.

In coated cutting tool of the present embodiment, $d_u$ in the upper layer is preferably 0.5 μm or more and 1.4 μm or less. In the coated cutting tool of the present embodiment, when $d_u$ in the upper layer is 0.5 μm or more, the proportion of columnar crystals on the lower layer side of the upper layer is increased, so that the chipping resistance tends to be improved, and when the du is 1.4 μm or less, coarsening of crystal grains in the α-type $Al_2O_3$ layer is suppressed, so that the chipping resistance tends to be improved. From the same viewpoint, in the coated cutting tool of the present embodiment, the $d_u$ in the upper layer is more preferably 0.5 μm or more and 1.2 μm or less, and further preferably 0.6 μm or more and 1.0 μm or less.

In the coated cutting tool of the present embodiment, $d_s$ in the upper layer is preferably 0.6 μm or more and 1.5 μm or less. In the coated cutting tool of the present embodiment, where $d_s$ in the upper layer is 0.6 μm or more, crystal grains of the α-type $Al_2O_3$ layer are prevented from falling off, so that the crater wear resistance tends to be improved, and where $d_s$ is 1.5 μm or less, coarsening of crystal grains in the α-type $Al_2O_3$ layer is suppressed, so that the chipping resistance tends to be improved. Furthermore, since the surface roughness tends to become smaller, the cutting resistance decreases and the chipping resistance tends to be improved. From the same viewpoint, in the coated cutting tool of the present embodiment, $d_s$ in the upper layer is more preferably 0.7 μm or more and 1.5 μm or less, and further preferably 0.9 μm or more and 1.5 μm or less.

In the present embodiment, $d_s$ and $d_u$ can be measured by the following method. A cross section in the direction perpendicular to the surface of the substrate is observed with an FE-SEM equipped with EBSD. When there is an orientation difference of 5 degrees or more between adjacent measurement points, that is defined as a grain boundary. A region surrounded by grain boundaries is defined as one crystal grain. A straight line in a direction parallel to the substrate is drawn at a position of a specific thickness of the α-type $Al_2O_3$ layer for which $d_s$ and $d_u$ are to be obtained. The value obtained by dividing the length of the straight line by the number of crystal grains is defined as the average grain size $d_s$ and $d_u$. At this time, the length of the straight line is preferably 20 μm or more. When the length of the straight line is shorter than 20 μm in the observed visual field, a plurality of visual fields may be observed so that the total length of the straight lines is 20 μm or more. Specifically, it can be measured by the method described in Examples described hereinbelow.

In the present embodiment, the upper layer may include α-type aluminum oxide (α-type $Al_2O_3$), and may include or not include components other than α-type aluminum oxide (α-type $Al_2O_3$) as long as the effects of the present invention are exhibited.

Outer Layer

In the coated cutting tool of the present embodiment, it is preferable that the coating layer includes an outer layer on the side opposite to the substrate side of the upper layer.

The outer layer used in this embodiment preferably includes a Ti compound layer composed of a Ti compound of Ti and an element of at least one kind selected from the group consisting of C, N and O. Examples of the Ti compound layer include a TiC layer composed of TiC, a TiN layer composed of TiN, a TiCN layer composed of TiCN, and a $TiB_2$ layer composed of $TiB_2$.

Among these, the outer layer used in the present embodiment preferably has a Ti compound layer such as a TiN layer or a TiCN layer. In the coated cutting tool of the present embodiment, since the outer layer has a Ti compound layer such as a TiN layer or a TiCN layer, the wear resistance tends to be improved, and the corners used tend to be easily identifiable. From the same viewpoint, the TiN layer is more preferable as the outer layer used in the present embodiment.

The average thickness of the outer layer used in the present embodiment is preferably 0.3 μm or more and 4.0 μm or less. When the average thickness of the outer layer of the coated cutting tool of the present embodiment is 0.3 μm or more, the effect of having the upper layer can be obtained, and where the average thickness of the outer layer is 4.0 μm or less, the fracture resistance is improved mainly due to the suppression of peeling of the coating layer. From the same viewpoint, in the coated cutting tool of the present embodiment, the average thickness of the outer layer is more preferably 0.3 μm or more and 3.5 μm or less, and further preferably 0.3 μm or more and 3.0 μm or less.

In the present embodiment, the outer layer may or may not include components other than the Ti compound such as TiN and TiCN as long as the effects of the present invention are exhibited.

In the coated cutting tool of the present embodiment, each layer constituting the coating layer may be formed by a chemical vapor deposition method or a physical vapor deposition method. Specific examples of the method for forming each layer include the following methods. However, these methods of forming each layer are not limiting.

Chemical Vapor Deposition Method

Lower Layer Formation Step

As the lower layer, for example, a Ti compound layer composed of a Ti compound consisting of Ti and an element of at least one kind selected from the group consisting of C, N and O can be formed as follows.

For example, when the Ti compound layer is a Ti nitride layer (hereinafter, also referred to as "TiN layer"), the layer can be formed by a chemical vapor deposition method in which the raw material composition is $TiCl_4$: 5.0 mol % to 10.0 mol %, $N_2$: 20 mol % to 60 mol %, $H_2$: balance, the temperature is 850° C. to 950° C. and the pressure is 300 hPa to 400 hPa.

When the Ti compound layer is a Ti carbide layer (hereinafter, also referred to as "TiC layer"), the layer can be formed by a chemical vapor deposition method in which the raw material composition is $TiCl_4$: 1.5 mol % to 3.5 mol %, $CH_4$: 3.5 mol % to 5.5 mol %, $H_2$: balance, the temperature is 950° C. to 1050° C. and the pressure is 70 hPa to 80 hPa.

When the Ti compound layer is a Ti carbonitride layer (hereinafter, also referred to as "TiCN layer"), the layer can be formed by a chemical vapor deposition method in which the raw material composition is $TiCl_4$: 4.0 mol % to 8.0 mol %, $CH_3CN$: 0.5 mol % to 1.5 mol %, $H_2$: balance, the temperature is 800° C. to 900° C. and the pressure is 60 hPa to 80 hPa.

When the Ti compound layer is a Ti carbonitride oxide layer (hereinafter, also referred to as "TiCNO layer"), the layer can be formed by a chemical vapor deposition method in which the raw material composition is $TiCl_4$: 1.0 mol % to 6.0 mol %, CO: 0.05 mol % to 2.0 mol %, $N_2$: 20 mol % to 45 mol %, $H_2$: balance, the temperature is 950° C. to 1020° C. and the pressure is 70 hPa to 120 hPa. When the TiCNO layer is formed as the third layer in the lower layer formation step, a smooth interface can be obtained by reducing the proportion of CO in the raw material gas composition, and as a result, the texture coefficient TC(0,0, 12) of the (0,0,12) plane of the α-type $Al_2O_3$ layer represented by the formula (1) in the upper layer to be formed next can be increased and can be set to the above-mentioned specific range. In order to increase the texture coefficient TC(0,0,12) and set the texture coefficient within the above-mentioned specific range, the ratio of CO in the raw material gas composition is preferably 2.0 mol % or less, more preferably 1.8 mol % or less, and particularly preferably 1.7 mol % or less.

When the Ti compound layer is a Ti oxycarbide layer (hereinafter, also referred to as "TiCO layer"), the layer can be formed by a chemical vapor deposition method in which the raw material composition is $TiCl_4$: 1.0 mol % to 6.0 mol %, CO: 0.05 mol % to 2.0 mol %, $H_2$: balance, the temperature is 950° C. to 1020° C. and the pressure is 70 hPa to 120 hPa.

Upper Layer Formation Step

As the upper layer, for example, an α-type $Al_2O_3$ layer composed of α-type $Al_2O_3$ (hereinafter, also simply referred to as "$Al_2O_3$ layer") can be formed as follows.

First, a lower layer composed of one or more Ti compound layers is formed on the surface of the substrate. Next, the surface of the lower layer farthest from the substrate is oxidized. Then, an upper layer including an α-type $Al_2O_3$ layer is formed on the surface of the layer farthest from the substrate.

More specifically, the oxidation of the surface of the layer farthest from the substrate in the lower layer is carried out under the conditions that the gas composition is $CO_2$: 0.2 mol % to 1.0 mol %, $H_2$: balance, the temperature is 950° C. to 1050° C., and the pressure is 50 hPa to 80 hPa (oxidation step). The oxidation treatment time at this time is preferably 1 min to 10 min.

After that, a nucleus of the α-type $Al_2O_3$ layer is formed on the surface of the layer farthest from the substrate (nucleation step). The nucleation step of the α-type $Al_2O_3$ layer is carried out under the conditions that the raw material gas composition is $AlCl_3$: 1.0 mol % to 4.0 mol %, CO: 0.05 mol % to 2.0 mol %, $CO_2$: 1.0 mol % to 3.0 mol %, HCl: 2.0 mol % to 3.0 mol %, $H_2$: balance, the temperature is 950° C. to 980° C., and the pressure is 60 hPa to 80 hPa. The time of the nucleation step is preferably 3 min to 5 min. Further, it is preferable that the temperature of the residual heat portion before introducing the raw material gas composition into the reaction vessel is in the range of 230° C. to 260° C. By setting the temperature of the residual heat portion within the aforementioned range, the ratio of the length of the Σ3 grain boundaries to the total length of 100% of the CSL grain boundaries in the upper layer can be set within the above-mentioned specific range. Specifically, the higher the temperature of the residual heat portion, the higher the ratio of the length of the Σ3 grain boundaries to 100% of the total length of the CSL grain boundaries tends to be.

After the nucleation of the α-type $Al_2O_3$ layer, an annealing step is performed. The annealing step is carried out under the conditions that the raw material gas composition is $H_2$: 100 mol %, the temperature is 950° C. to 1020° C., and the pressure is 70 hPa to 200 hPa. The time of the annealing step is preferably 45 min to 70 min. By performing the annealing step within the aforementioned time range after the nucleation step, the ratio of the length of the Σ3 grain boundaries to the total length of 100% of the total grain boundary in the upper layer can be set to the aforementioned specific range. Specifically, the longer the annealing step is, the higher the ratio of the length of the Σ3 grain boundaries to 100% of the total length of the total grain boundary in the upper layer tends to be. Further, where the annealing step is not performed, the ratio of the length of the Σ3 grain boundaries to the total length of 100% of all the grain boundary in the upper layer tends to be extremely small.

After that, the α-type $Al_2O_3$ layer is formed by a chemical vapor deposition method in which the raw material gas composition is $AlCl_3$: 1.0 mol % to 5.0 mol %, $CO_2$: 2.5 mol % to 4.0 mol %, HCl: 2.0 mol % to 3.0 mol %, $H_2S$: 0.15 mol % to 0.25 mol %, $H_2$: balance, the temperature is 950° C. to 1000° C. and the pressure is 60 hPa to 80 hPa (film formation step). In the film formation step, it is preferable to perform gradual cooling at a rate of 0.5° C./min to 2.0° C./min. By gradually cooling at the above speed In the film formation step, the average grain size $d_s$ in the upper layer can be set to the abovementioned specific range, and the average grain size ratio $[d_s/d_u]$ in the upper layer can be set to the abovementioned specific range. Further, in the film formation step, the formation of new nuclei can be suppressed by reducing the ratio of $CO_2$ in the raw material gas composition, and as a result, in the upper layer, the texture coefficient TC(0,0,12) of the (0,0,12) plane of the α-type $Al_2O_3$ layer represented by the formula (1) can be increased and can be set to the abovementioned specific range.

Further, in order to set the ratio of the length of the Σ3 grain boundaries to the total length of 100% of CSL grain boundaries in the upper layer in the abovementioned specific range, the pressure may be controlled, or the average thickness of the upper layer may be controlled, or the ratio of $TiCl_4$ in the raw material composition may be controlled in the upper layer formation step. More specifically, the ratio of the length of the Σ3 grain boundaries in the upper layer can be increased by lowering the pressure in the upper layer formation step or increasing the ratio of $TiCl_4$ in the raw material composition. Further, by increasing the average thickness of the upper layer, the ratio of the length of the Σ3 grain boundaries in the upper layer can be reduced.

Outer Layer Formation Step

Further, an outer layer composed of a Ti nitride layer (hereinafter, also referred to as "TiN layer") or a Ti carbonitride layer (hereinafter, also referred to as "TiCN layer") may be formed on the surface of the upper layer.

The TiN layer as the outer layer can be formed by a chemical vapor deposition method in which the raw material composition is $TiCl_4$: 7.0 mol % to 8.0 mol %, $N_2$: 30 mol % to 50 mol %, $H_2$: balance, the temperature is 950° C. to 1050° C., and the pressure is 300 hPa to 400 hPa.

The TiCN layer as the outer layer can be formed by a chemical vapor deposition method in which the raw material composition is $TiCl_4$: 7.0 mol % to 9.0 mol %, $CH_3CN$: 0.7 mol % to 2.0 mol %, $CH_4$: 1.0 mol % to 2.0 mol %, $N_2$: 4.0 mol % to 6.0 mol %, $H_2$: balance, the temperature is 950° C. to 1050° C., and the pressure is 60 hPa to 80 hPa.

The thickness of each layer in the coating layer of the coated cutting tool of the present embodiment can be measured by observing the cross-sectional structure of the coated cutting tool by using as an optical microscope, a scanning electron microscope (SEM), or a field emission scanning electron microscope (FE-SEM). The average thickness of each layer in the coated cutting tool of the present embodiment can be obtained as the arithmetic mean value by measuring the thickness of each layer at three or more points near a position of 50 μm from the edge line of the cutting edge toward the center of the rake surface of the coated cutting tool. Further, the composition of each layer in the coating layer of the coated cutting tool of the present embodiment can be measured from the cross-sectional structure of the coated cutting tool by using an energy dispersive X-ray spectroscope (EDS), a wavelength dispersive X-ray spectroscope (WDS), or the like.

It is considered that the coated cutting tool of the present embodiment exerts an effect that the tool life can be extended as compared with the conventional cutting tools because of excellent chipping resistance and wear resistance. However, these factors that can extend the tool life are not limiting.

EXAMPLES

Hereinafter, the present invention will be described in more detail with reference to Examples, but the present invention is not limited to these Examples.

As a substrate, a cemented carbide having a composition of 89.2WC-8.8Co-2.0NbC (% by mass) was prepared by processing into an insert shape of CNMG120408. The edge line of the cutting edge of the substrate was subjected to round honing with a SiC brush, and then the surface of the substrate was cleaned.

Invention Samples 1 to 14 and Comparative Samples 1 to 11

After cleaning the surface of the substrate, the coating layer was formed by a chemical vapor deposition method. First, the substrate was loaded into a chemical vapor deposition apparatus of an external heating type, and under the conditions of the raw material gas composition, temperature and pressure shown in Tables 1 and 3, the lower layer having the composition shown in Table 2 was formed on the surface of the substrate in the order of the first layer, second layer, and third layer so as to have the average thickness shown in Table 2. Next, the surface of the lower layer was subjected to an oxidation treatment for 2 min under the conditions of a gas composition of $CO_2$: 0.3 mol %, $H_2$: 99.7 mol %, a temperature of 1000° C., and a pressure of 70 hPa. Then, under the conditions shown in Table 4, a nucleus of the α-type $Al_2O_3$ layer was formed on the surface of the lower layer. At that time, the temperature of the residual heat portion before introducing the raw material gas composition into the reaction vessel was set as shown in Table 4. After nucleation of the α-type $Al_2O_3$ layer, an annealing step was performed under the conditions shown in Table 5. Next, under the conditions of the raw material gas composition, temperature, and pressure shown in Table 6, the upper layer having the composition shown in Table 2 was formed on the surface of the third layer of the lower layer so as to have the average thickness shown in Table 2. Finally, under the conditions of the raw material gas composition, temperature and pressure shown in Table 1, the outer layer having the composition shown in Table 2 was formed on the surface of the upper layer so as to have the average thickness shown in Table 2. In this way, the coated cutting tools of invention samples 1 to 14 and comparative samples 1 to 11 were obtained.

TABLE 1

| Composition of each layer | | Temperature (° C.) | Pressure (hPa) | Raw material composition (mol %) |
|---|---|---|---|---|
| Lower layer | TiN (first layer) | 900 | 350 | $TiCl_4$: 7.5%, $N_2$: 40.0%, $H_2$: 52.5% |
| | TiC (first layer) | 1000 | 75 | $TiCl_4$: 2.4%, $CH_4$: 4.6%, $H_2$: 93.0% |
| | TiCN (second layer) | 850 | 70 | $TiCl_4$: 6.0%, $CH_3CN$: 1.0%, $H_2$: 93.0% |
| Outer layer | TiN | 1000 | 350 | $TiCl_4$: 7.5%, $N_2$: 40.0%, $H_2$: 52.5% |

TABLE 2

| Sample No. | Coating layer Lower layer | | | | | | |
|---|---|---|---|---|---|---|---|
| | First layer | | Second layer | | Third layer | | Total |
| | Composition | Average thickness (μm) | Composition | Average thickness (μm) | Composition | Average thickness (μm) | thickness of lower layer (μm) |
| Invention sample 1 | TiN | 0.3 | TiCN | 10.0 | TiCNO | 0.4 | 10.7 |
| Invention sample 2 | TiN | 0.3 | TiCN | 10.0 | TiCNO | 0.4 | 10.7 |
| Invention sample 3 | TiN | 0.3 | TiCN | 10.0 | TiCNO | 0.4 | 10.7 |
| Invention sample 4 | TiN | 0.3 | TiCN | 2.5 | TiCNO | 0.4 | 3.2 |
| Invention sample 5 | TiN | 0.3 | TiCN | 13.0 | TiCNO | 0.7 | 14.0 |

TABLE 2-continued

| Sample No. | | | | | | |
|---|---|---|---|---|---|---|
| Invention sample 6 | TiN | 0.3 | TiCN | 10.0 | TiCNO | 0.4 | 10.7 |
| Invention sample 7 | TiN | 0.3 | TiCN | 6.0 | TiCNO | 0.4 | 6.7 |
| Invention sample 8 | TiN | 0.3 | TiCN | 10.0 | TiCNO | 0.4 | 10.7 |
| Invention sample 9 | TiN | 0.3 | TiCN | 10.0 | TiCNO | 0.4 | 10.7 |
| Invention sample 10 | TiN | 0.3 | TiCN | 10.0 | TiCNO | 0.4 | 10.7 |
| Invention sample 11 | TiN | 0.3 | TiCN | 10.0 | TiCNO | 0.4 | 10.7 |
| Invention sample 12 | TiC | 0.3 | TiCN | 7.0 | TiCNO | 0.4 | 7.7 |
| Invention sample 13 | TiN | 0.3 | TiCN | 11.0 | TiCO | 0.4 | 11.7 |
| Invention sample 14 | TiN | 0.3 | TiCN | 7.0 | TiCNO | 0.4 | 7.7 |
| Comparative sample 1 | TiN | 0.2 | TiCN | 6.2 | TiCNO | 0.7 | 7.1 |
| Comparative sample 2 | TiN | 0.2 | TiCN | 7.2 | TiCNO | 0.4 | 7.8 |
| Comparative sample 3 | TiN | 0.2 | TiCN | 9.0 | TiCNO | 1.8 | 11.0 |
| Comparative sample 4 | TiN | 0.2 | TiCN | 3.0 | TiCNO | 0.4 | 3.6 |
| Comparative sample 5 | TiN | 0.2 | TiCN | 4.0 | TiCNO | 0.4 | 4.6 |
| Comparative sample 6 | TiN | 0.3 | TiCN | 12.0 | TiCNO | 0.4 | 12.7 |
| Comparative sample 7 | TiN | 0.3 | TiCN | 6.0 | TiCNO | 0.4 | 6.7 |
| Comparative sample 8 | TiN | 0.3 | TiCN | 1.0 | TiCNO | 0.4 | 1.7 |
| Comparative sample 9 | TiN | 0.3 | TiCN | 16.0 | TiCNO | 0.7 | 17.0 |
| Comparative sample 10 | TiN | 0.3 | TiCN | 10.0 | TiCNO | 0.4 | 10.7 |
| Comparative sample 11 | TiN | 0.3 | TiCN | 10.0 | TiCNO | 0.4 | 10.7 |

| | Coating layer | | | | | |
|---|---|---|---|---|---|---|
| | | Upper layer | | Outer layer | | Average thickness of entire coating layer ($\mu$m) |
| Sample No. | Composition | Crystal system | Average thickness ($\mu$m) | Composition | Average thickness ($\mu$m) | |
| Invention sample 1 | $Al_2O_3$ | $\alpha$ | 7.0 | TiN | 0.3 | 18.0 |
| Invention sample 2 | $Al_2O_3$ | $\alpha$ | 7.0 | TiN | 0.3 | 18.0 |
| Invention sample 3 | $Al_2O_3$ | $\alpha$ | 7.0 | TiN | 0.3 | 18.0 |
| Invention sample 4 | $Al_2O_3$ | $\alpha$ | 7.0 | TiN | 0.3 | 10.5 |
| Invention sample 5 | $Al_2O_3$ | $\alpha$ | 7.0 | TiN | 0.3 | 21.3 |
| Invention sample 6 | $Al_2O_3$ | $\alpha$ | 3.6 | TiN | 0.3 | 14.6 |
| Invention sample 7 | $Al_2O_3$ | $\alpha$ | 14.0 | TiN | 0.3 | 21.0 |
| Invention sample 8 | $Al_2O_3$ | $\alpha$ | 7.0 | TiN | 0.3 | 18.0 |
| Invention sample 9 | $Al_2O_3$ | $\alpha$ | 7.0 | TiN | 0.3 | 18.0 |
| Invention sample 10 | $Al_2O_3$ | $\alpha$ | 7.0 | TiN | 0.3 | 18.0 |
| Invention sample 11 | $Al_2O_3$ | $\alpha$ | 7.0 | TiN | 0.3 | 18.0 |
| Invention sample 12 | $Al_2O_3$ | $\alpha$ | 5.0 | TiN | 0.3 | 13.0 |
| Invention sample 13 | $Al_2O_3$ | $\alpha$ | 8.0 | TiN | 0.3 | 20.0 |
| Invention sample 14 | $Al_2O_3$ | $\alpha$ | 7.0 | TiN | 4.0 | 18.7 |
| Comparative sample 1 | $Al_2O_3$ | $\alpha$ | 9.0 | TiN | 0.3 | 16.4 |
| Comparative sample 2 | $Al_2O_3$ | $\alpha$ | 12.0 | TiN | 0.2 | 20.0 |
| Comparative sample 3 | $Al_2O_3$ | $\alpha$ | 6.5 | TiN | 0.1 | 17.6 |
| Comparative sample 4 | $Al_2O_3$ | $\alpha$ | 3.5 | TiN | 0.2 | 7.3 |
| Comparative sample 5 | $Al_2O_3$ | $\alpha$ | 7.2 | TiN | 0.3 | 12.1 |
| Comparative sample 6 | $Al_2O_3$ | $\alpha$ | 2.5 | TiN | 3.0 | 18.2 |
| Comparative sample 7 | $Al_2O_3$ | $\alpha$ | 17.0 | TiN | 0.3 | 24.0 |
| Comparative sample 8 | $Al_2O_3$ | $\alpha$ | 7.0 | TiN | 1.5 | 10.2 |
| Comparative sample 9 | $Al_2O_3$ | $\alpha$ | 4.0 | TiN | 0.3 | 21.3 |
| Comparative sample 10 | $Al_2O_3$ | $\alpha$ | 7.0 | TiN | 0.3 | 18.0 |
| Comparative sample 11 | $Al_2O_3$ | $\alpha$ | 7.0 | TiN | 0.3 | 18.0 |

TABLE 3

| | Third layer of lower layer | | | | | |
|---|---|---|---|---|---|---|
| | Temperature | Pressure | Raw material composition (mol %) | | | |
| Sample No. | (° C.) | (hPa) | $TiCl_4$ | CO | $N_2$ | $H_2$ |
| Invention sample 1 | 1000 | 100 | 4.0 | 1.0 | 40.0 | 55.0 |
| Invention sample 2 | 1000 | 100 | 4.0 | 1.8 | 40.0 | 54.2 |
| Invention sample 3 | 970 | 100 | 4.0 | 0.4 | 40.0 | 55.6 |
| Invention sample 4 | 1000 | 100 | 4.0 | 1.0 | 25.0 | 70.0 |
| Invention sample 5 | 1000 | 100 | 3.0 | 1.0 | 40.0 | 56.0 |
| Invention sample 6 | 1000 | 100 | 4.0 | 1.7 | 40.0 | 54.3 |
| Invention sample 7 | 1000 | 100 | 4.0 | 0.4 | 40.0 | 55.6 |
| Invention sample 8 | 1000 | 100 | 4.0 | 1.0 | 40.0 | 55.0 |
| Invention sample 9 | 1000 | 100 | 4.0 | 1.0 | 25.0 | 70.0 |
| Invention sample 10 | 1000 | 100 | 4.0 | 1.0 | 40.0 | 55.0 |
| Invention sample 11 | 1000 | 100 | 4.0 | 1.0 | 40.0 | 55.0 |
| Invention sample 12 | 1000 | 100 | 5.0 | 1.6 | 40.0 | 53.4 |

TABLE 3-continued

| | Third layer of lower layer | | | | | |
|---|---|---|---|---|---|---|
| | Temperature | Pressure | Raw material composition (mol %) | | | |
| Sample No. | (° C.) | (hPa) | $TiCl_4$ | CO | $N_2$ | $H_2$ |
| Invention sample 13 | 1000 | 80 | 4.0 | 0.6 | 0.0 | 95.4 |
| Invention sample 14 | 970 | 100 | 4.0 | 1.0 | 40.0 | 55.0 |
| Comparative sample 1 | 1000 | 100 | 4.0 | 1.8 | 40.0 | 54.2 |
| Comparative sample 2 | 1000 | 100 | 4.0 | 2.4 | 40.0 | 53.6 |
| Comparative sample 3 | 970 | 100 | 4.0 | 0.4 | 40.0 | 55.6 |
| Comparative sample 4 | 1000 | 100 | 4.0 | 3.0 | 40.0 | 53.0 |
| Comparative sample 5 | 1000 | 100 | 4.0 | 2.4 | 40.0 | 53.6 |
| Comparative sample 6 | 1000 | 100 | 4.0 | 1.7 | 40.0 | 54.3 |
| Comparative sample 7 | 1000 | 100 | 4.0 | 0.6 | 40.0 | 55.4 |
| Comparative sample 8 | 1000 | 100 | 4.0 | 1.0 | 25.0 | 70.0 |
| Comparative sample 9 | 970 | 100 | 3.0 | 1.0 | 40.0 | 56.0 |
| Comparative sample 10 | 1000 | 100 | 4.0 | 2.3 | 40.0 | 53.7 |
| Comparative sample 11 | 1000 | 100 | 4.0 | 1.0 | 25.0 | 70.0 |

TABLE 4

| | Temperature of residual heat portion | Upper layer (nucleation step) | | | | | | | |
|---|---|---|---|---|---|---|---|---|---|
| | | Temperature | Pressure | Raw material composition (mol %) | | | | | Time |
| Sample No. | (° C.) | (° C.) | (hPa) | $AlCl_3$ | CO | $CO_2$ | HCl | $H_2$ | (min) |
| Invention sample 1 | 255 | 950 | 70 | 2.0 | 1.0 | 1.5 | 2.5 | 93.0 | 5 |
| Invention sample 2 | 255 | 950 | 60 | 2.0 | 2.0 | 1.5 | 2.5 | 92.0 | 5 |
| Invention sample 3 | 255 | 950 | 80 | 2.0 | 0.5 | 1.5 | 2.5 | 93.5 | 5 |
| Invention sample 4 | 255 | 950 | 70 | 2.5 | 1.0 | 2.0 | 2.5 | 92.0 | 5 |
| Invention sample 5 | 255 | 970 | 70 | 2.5 | 1.0 | 2.0 | 2.5 | 92.0 | 5 |
| Invention sample 6 | 255 | 950 | 70 | 2.0 | 2.0 | 1.5 | 2.5 | 92.0 | 3 |
| Invention sample 7 | 255 | 950 | 70 | 2.0 | 0.5 | 1.0 | 2.5 | 94.0 | 5 |
| Invention sample 8 | 245 | 950 | 70 | 2.0 | 1.0 | 1.5 | 2.5 | 93.0 | 5 |
| Invention sample 9 | 255 | 970 | 70 | 2.0 | 1.0 | 1.5 | 2.5 | 93.0 | 5 |
| Invention sample 10 | 235 | 950 | 70 | 2.0 | 1.0 | 1.5 | 2.2 | 93.3 | 5 |
| Invention sample 11 | 255 | 970 | 70 | 2.0 | 1.0 | 1.5 | 2.5 | 93.0 | 5 |
| Invention sample 12 | 245 | 950 | 70 | 2.0 | 1.0 | 1.5 | 2.5 | 92.5 | 3 |
| Invention sample 13 | 255 | 950 | 70 | 2.5 | 0.5 | 1.5 | 2.5 | 93.0 | 5 |
| Invention sample 14 | 255 | 950 | 70 | 2.5 | 1.0 | 1.5 | 2.2 | 92.8 | 5 |
| Comparative sample 1 | 245 | 950 | 70 | 2.0 | 2.0 | 1.5 | 2.5 | 92.0 | 5 |
| Comparative sample 2 | 245 | 980 | 60 | 2.0 | 2.5 | 2.0 | 2.5 | 91.0 | 5 |
| Comparative sample 3 | 245 | 950 | 80 | 2.0 | 0.5 | 1.0 | 2.5 | 94.0 | 5 |
| Comparative sample 4 | 235 | 950 | 70 | 2.5 | 1.0 | 1.0 | 2.5 | 93.0 | 3 |
| Comparative sample 5 | 210 | 950 | 70 | 2.0 | 2.5 | 1.5 | 2.5 | 91.5 | 5 |
| Comparative sample 6 | 255 | 950 | 70 | 2.0 | 2.0 | 1.5 | 2.2 | 92.3 | 3 |
| Comparative sample 7 | 255 | 970 | 70 | 2.0 | 0.5 | 1.5 | 2.2 | 93.8 | 5 |
| Comparative sample 8 | 255 | 950 | 60 | 2.0 | 1.0 | 1.5 | 2.5 | 93.0 | 5 |
| Comparative sample 9 | 255 | 950 | 80 | 2.0 | 1.0 | 1.5 | 2.5 | 93.0 | 3 |
| Comparative sample 10 | 255 | 950 | 70 | 2.5 | 2.5 | 1.0 | 2.5 | 91.5 | 5 |
| Comparative sample 11 | 245 | 950 | 70 | 2.5 | 1.0 | 1.0 | 2.5 | 93.0 | 5 |

TABLE 5

| | Upper layer (annealing step) | | | |
|---|---|---|---|---|
| | Temperature | Pressure | Raw material composition (mol %) | Time |
| Sample No. | (° C.) | (hPa) | $H_2$ | (min) |
| Invention sample 1 | 1000 | 120 | 100.0 | 50 |
| Invention sample 2 | 1000 | 120 | 100.0 | 50 |
| Invention sample 3 | 1000 | 170 | 100.0 | 50 |
| Invention sample 4 | 1000 | 120 | 100.0 | 50 |
| Invention sample 5 | 1000 | 120 | 100.0 | 50 |
| Invention sample 6 | 1000 | 120 | 100.0 | 50 |
| Invention sample 7 | 1000 | 120 | 100.0 | 60 |
| Invention sample 8 | 1000 | 120 | 100.0 | 45 |
| Invention sample 9 | 1000 | 120 | 100.0 | 65 |
| Invention sample 10 | 1000 | 120 | 100.0 | 50 |
| Invention sample 11 | 1000 | 120 | 100.0 | 60 |
| Invention sample 12 | 1000 | 120 | 100.0 | 50 |
| Invention sample 13 | 1000 | 120 | 100.0 | 60 |
| Invention sample 14 | 1000 | 170 | 100.0 | 50 |
| Comparative sample 1 | No annealing | | | |
| Comparative sample 2 | 1000 | 120 | 100.0 | 20 |
| Comparative sample 3 | 1000 | 120 | 100.0 | 40 |
| Comparative sample 4 | 1000 | 120 | 100.0 | 30 |
| Comparative sample 5 | No annealing | | | |
| Comparative sample 6 | 1000 | 70 | 100.0 | 50 |
| Comparative sample 7 | 1000 | 70 | 100.0 | 50 |
| Comparative sample 8 | 1000 | 70 | 100.0 | 50 |

TABLE 5-continued

| | Upper layer (annealing step) | | | |
|---|---|---|---|---|
| Sample No. | Temperature (° C.) | Pressure (hPa) | Raw material composition (mol %) $H_2$ | Time (min) |
| Comparative sample 9 | 1000 | 70 | 100.0 | 50 |
| Comparative sample 10 | 1000 | 70 | 100.0 | 50 |
| Comparative sample 11 | 1000 | 70 | 100.0 | 40 |

TABLE 6

| | Upper layer (film formation step) | | | | | | | |
|---|---|---|---|---|---|---|---|---|
| | Temperature during film formation step | Cooling rate | | Raw material composition (mol %) | | | | |
| Sample No. | (° C.) | (° C./min) | Pressure (hPa) | $AlCl_3$ | $CO_2$ | HCl | $H_2S$ | $H_2$ |
| Invention sample 1 | 1000 | 1.5 | 70 | 2.5 | 3.0 | 2.5 | 0.20 | 91.8 |
| Invention sample 2 | 980 | 0.5 | 60 | 3.0 | 3.5 | 2.5 | 0.20 | 90.8 |
| Invention sample 3 | 1000 | 1.5 | 80 | 2.0 | 2.5 | 2.5 | 0.20 | 92.8 |
| Invention sample 4 | 1000 | 0.5 | 70 | 3.0 | 3.0 | 2.5 | 0.15 | 91.4 |
| Invention sample 5 | 1000 | 1.5 | 70 | 2.5 | 3.0 | 2.5 | 0.20 | 91.8 |
| Invention sample 6 | 1000 | 0.5 | 70 | 2.5 | 3.5 | 2.5 | 0.20 | 91.3 |
| Invention sample 7 | 1000 | 0.5 | 70 | 2.5 | 2.5 | 2.5 | 0.20 | 92.3 |
| Invention sample 8 | 1000 | 1.5 | 70 | 2.5 | 3.0 | 2.5 | 0.25 | 91.8 |
| Invention sample 9 | 1000 | 0.5 | 70 | 3.0 | 3.0 | 2.5 | 0.20 | 91.3 |
| Invention sample 10 | 1000 | 1.5 | 70 | 2.5 | 3.0 | 2.2 | 0.20 | 92.1 |
| Invention sample 11 | 1000 | 1.5 | 70 | 2.5 | 3.0 | 2.5 | 0.20 | 91.8 |
| Invention sample 12 | 980 | 0.5 | 70 | 2.5 | 3.5 | 2.5 | 0.20 | 91.3 |
| Invention sample 13 | 1000 | 0.5 | 70 | 1.5 | 2.8 | 2.5 | 0.20 | 93.0 |
| Invention sample 14 | 1000 | 1.5 | 70 | 1.2 | 3.0 | 2.2 | 0.20 | 93.4 |
| Comparative sample 1 | 1000 | 1.0 | 70 | 2.5 | 3.5 | 2.5 | 0.20 | 91.3 |
| Comparative sample 2 | 1000 | 0.0 | 60 | 2.5 | 4.5 | 2.5 | 0.20 | 90.3 |
| Comparative sample 3 | 1000 | 0.0 | 80 | 3.0 | 2.5 | 2.5 | 0.20 | 91.8 |
| Comparative sample 4 | 1000 | 1.0 | 70 | 2.5 | 5.0 | 2.5 | 0.20 | 89.8 |
| Comparative sample 5 | 1000 | 1.0 | 70 | 2.5 | 4.5 | 2.5 | 0.20 | 90.3 |
| Comparative sample 6 | 1000 | 0.5 | 70 | 2.5 | 3.5 | 2.2 | 0.20 | 91.6 |
| Comparative sample 7 | 1000 | 0.5 | 70 | 2.5 | 2.5 | 2.2 | 0.15 | 92.7 |
| Comparative sample 8 | 1000 | 0.5 | 60 | 3.0 | 3.0 | 2.5 | 0.20 | 91.3 |
| Comparative sample 9 | 1000 | 2.0 | 80 | 3.0 | 3.0 | 2.5 | 0.20 | 91.3 |
| Comparative sample 10 | 1000 | 0.5 | 70 | 2.5 | 4.5 | 2.5 | 0.20 | 90.3 |
| Comparative sample 11 | 1000 | 0.5 | 70 | 2.5 | 3.0 | 2.5 | 0.25 | 91.8 |

Average Thickness of Each Layer

The average thickness of each layer of the obtained samples was determined as follows. That is, using the FE-SEM, the thickness at three points in the cross section near a position of 50 μm from the edge line of the cutting edge of the coated cutting tool toward the center of the rake surface was measured and the arithmetic mean value thereof was obtained as the average thickness. The measurement results are shown in Table 2.

Composition of Each Layer

The composition of each layer of the obtained sample was measured by using EDS in a cross section near a position at up to 50 μm from the edge line of the cutting edge of the coated cutting tool to the center of the rake surface. The measurement results are shown in Table 2.

Length of CSL Grain Boundaries and Length of Σ3 Grain Boundaries

The length of the CSL grain boundaries and the length of the Σ3 grain boundaries in the upper layer of the obtained sample were measured as follows. First, in the coated cutting tool, an observation surface was obtained by polishing until the cross section of the upper layer was exposed in a direction parallel to the surface of the substrate. Further, the obtained observation surface was polished with colloidal silica to obtain a mirror-surface observation surface.

After that, the above observation surface was observed by an SEM equipped with EBSD. As the observation area, a flank was observed.

As the SEM, SU6600 (manufactured by Hitachi High-Technologies Corporation) equipped with EBSD (manufactured by TexSEM Laboratories) was used.

The normal of the observation surface was tilted 70° with respect to the incident beam, and the analysis was performed by irradiating with an electron beam at an acceleration voltage of 15 kV and an irradiation current of 1.0 nA. Data were collected in steps of 0.05 μm/step for 1000×600 points corresponding to a 50 μm×30 μm surface region of the upper layer on the observation surface. The data were collected for a surface region of 5 visual fields (50 μm×30 μm of the upper layer), and the average value was calculated.

Data processing was performed using commercially available software. It was confirmed by counting the CSL grain boundaries corresponding to an arbitrary Σ value and expressing the ratio of each grain boundary as a ratio to the total crystal grain boundary. From the above, the length of the Σ3 grain boundaries, the length of the CSL grain boundaries, and the total length of the total grain boundary were obtained, and the ratio of the length of the Σ3 grain boundaries to the total length of 100% of the total grain boundary, and the ratio of the length of the Σ3 grain boundaries to the total length of 100% of the CSL grain boundaries were calculated. The results are shown in Table 7.

Texture Coefficient TC(0,0,12) of (0,0,12) Plane of α-Type $Al_2O_3$ Layer

For the obtained samples, X-ray diffraction measurement of the 2θ/θ concentrated optical system using Cu-Kα rays was performed under the conditions of output: 50 kV, 250 mA, incident side solar slit: 5°, divergent vertical slit: 2/3°, emission vertical limiting slit: 5 mm, scattering slit: 2/3°, light receiving-side solar slit: 5°, light receiving slit: 0.3 mm, BENT monochrome meter, light receiving monochrome slit: 0.8 mm, sampling width: 0.01°, scan speed: 4°/min, and 2θ measurement range: 20° to 155°. An X-ray diffractometer (model "RINT TTRIII") manufactured by Rigaku Co., Ltd. was used as the apparatus. The peak intensity of each crystal plane of the α-type $Al_2O_3$ layer was determined from the X-ray diffraction pattern. From the peak intensity of each crystal plane obtained, the texture coefficient TC(0,0,12) of the (0,0,12) plane of the α-type $Al_2O_3$ layer was determined. The results are shown in Table 7.

Average Grain Size $d_s$ and $d_u$

For the obtained sample, the average grain size $d_s$ and $d_u$ were measured as follows. A cross section in the direction perpendicular to the surface of the substrate was observed with an FE-SEM equipped with EBSD. When there was an orientation difference of 5 degrees or more between adjacent measurement points, that was defined as a grain boundary. A region surrounded by grain boundaries was defined as one crystal grain. A straight line in a direction parallel to the substrate was drawn at a position of a specific thickness of the α-type $Al_2O_3$ layer for which $d_s$ and $d_u$ were to be obtained. The value obtained by dividing the length of the straight line by the number of crystal grains was defined as the average grain size $d_s$ and $d_u$. At this time, the length of the straight line was 30 μm or more. The results are shown in Table 7.

TABLE 7

| | Upper layer | | | | | |
|---|---|---|---|---|---|---|
| | TC(0, 0, 12) | Ratio of length of Σ3 grain boundaries to total length of total grain boundary (%) | Ratio of length of Σ3 grain boundaries to total length of CSL grain boundaries (%) | $d_u$ (μm) | $d_s$ (μm) | $d_s/d_u$ |
| Invention sample 1 | 8.4 | 64 | 92 | 0.7 | 1.0 | 1.4 |
| Invention sample 2 | 8.0 | 65 | 95 | 0.7 | 1.1 | 1.6 |
| Invention sample 3 | 8.9 | 63 | 94 | 0.7 | 1.0 | 1.4 |
| Invention sample 4 | 8.4 | 62 | 91 | 0.6 | 0.9 | 1.5 |
| Invention sample 5 | 8.5 | 64 | 93 | 0.9 | 1.3 | 1.4 |
| Invention sample 6 | 8.2 | 62 | 88 | 0.7 | 1.1 | 1.6 |
| Invention sample 7 | 8.8 | 67 | 93 | 0.8 | 1.3 | 1.6 |
| Invention sample 8 | 8.4 | 54 | 82 | 0.7 | 1.0 | 1.4 |
| Invention sample 9 | 8.4 | 78 | 96 | 0.9 | 1.5 | 1.7 |
| Invention sample 10 | 8.4 | 60 | 75 | 0.7 | 1.0 | 1.4 |
| Invention sample 11 | 8.4 | 70 | 97 | 1.0 | 1.3 | 1.3 |
| Invention sample 12 | 8.3 | 59 | 85 | 0.8 | 1.0 | 1.3 |
| Invention sample 13 | 8.6 | 68 | 95 | 0.8 | 1.2 | 1.5 |
| Invention sample 14 | 8.4 | 65 | 91 | 0.8 | 1.0 | 1.3 |
| Comparative sample 1 | 8.0 | 3 | 82 | 0.6 | 1.1 | 1.8 |
| Comparative sample 2 | 7.5 | 25 | 80 | 1.2 | 2.2 | 1.8 |
| Comparative sample 3 | 8.8 | 48 | 82 | 0.6 | 1.3 | 2.2 |
| Comparative sample 4 | 3.5 | 35 | 78 | 0.5 | 0.8 | 1.6 |
| Comparative sample 5 | 7.6 | 5 | 64 | 0.4 | 0.8 | 2.0 |
| Comparative sample 6 | 8.2 | 62 | 92 | 0.6 | 1.0 | 1.7 |
| Comparative sample 7 | 8.6 | 65 | 94 | 1.0 | 1.7 | 1.7 |
| Comparative sample 8 | 8.4 | 63 | 92 | 0.6 | 0.9 | 1.5 |
| Comparative sample 9 | 8.5 | 61 | 90 | 0.8 | 0.9 | 1.1 |
| Comparative sample 10 | 7.7 | 59 | 89 | 0.7 | 1.0 | 1.4 |
| Comparative sample 11 | 8.3 | 48 | 83 | 0.6 | 0.9 | 1.5 |

Using the obtained invention samples 1 to 14 and comparative samples 1 to 11, cutting tests 1 and 2 were performed under the following conditions. The results of cutting tests 1 and 2 are shown in Table 8.

Cutting Test 1

Insert: CNMG120408
Base material: 89.2WC-8.8Co-2.0NbC (% by mass)
Work material: round bar of S45C (diameter 150 mm×length 400 mm)
Cutting speed: 300 m/min
Feed: 0.50 mm/rev
Cutting depth: 2.0 mm
Coolant: used
Evaluation item: the tool life was assumed when the sample had a defect or the maximum flank surface wear width reached 0.3 mm or the amount of plastic deformation reached 0.3 mm, and the machining time until the tool life was measured.

Cutting Test 2

Insert: CNMG120408
Base material: 89.2WC-8.8Co-2.0NbC (% by mass)
Work material: SCM415 round bar (diameter 150 mm×length 400 mm) with four grooves on the outer circumference
Cutting speed: 250 m/min
Feed: 0.30 mm/rev
Cutting depth: 1.0 mm
Coolant: used
Evaluation item: the tool life was assumed when the sample was chipped (width 0.2 mm or more) or fractured, and the machining time until the tool life was measured.

TABLE 8

| Sample No. | Cutting test 1 Tool life (min) | Cutting test 2 Tool life (min) |
| --- | --- | --- |
| Invention sample 1 | 24.2 | 20.4 |
| Invention sample 2 | 24.6 | 18.2 |
| Invention sample 3 | 23.8 | 20.5 |
| Invention sample 4 | 21.8 | 20.8 |
| Invention sample 5 | 24.9 | 19.4 |
| Invention sample 6 | 22.4 | 19 |
| Invention sample 7 | 27.2 | 16.8 |
| Invention sample 8 | 22.3 | 21 |
| Invention sample 9 | 27.1 | 16.8 |
| Invention sample 10 | 23.5 | 20.4 |
| Invention sample 11 | 25.6 | 22.7 |
| Invention sample 12 | 21.8 | 25 |
| Invention sample 13 | 25.8 | 18.6 |
| Invention sample 14 | 24.6 | 23.6 |
| Comparative sample 1 | 12.4 | 15.5 |
| Comparative sample 2 | 18.6 | 12.2 |
| Comparative sample 3 | 20.8 | 12 |
| Comparative sample 4 | 8.2 | 22 |
| Comparative sample 5 | 9.2 | 14.8 |
| Comparative sample 6 | 8.2 | 15.2 |
| Comparative sample 7 | 16 | 5.2 |
| Comparative sample 8 | 7.8 | 4.5 |
| Comparative sample 9 | 12.5 | 18 |
| Comparative sample 10 | 10.5 | 16.2 |
| Comparative sample 11 | 10.8 | 17 |

From the results shown in Table 8, in each of the inventions, the machining time to the tool life in the cutting test 1 was 20 min or more, and the machining time to the tool life in the cutting test 2 was 15 min or more. Meanwhile, in the comparative sample, the machining time to the tool life in the cutting test 1 was less than 20 min, and/or the machining time to the tool life in the cutting test 2 was less than 15 min. Therefore, it can be seen that the wear resistance and fracture resistance of the invention samples are generally superior to those of the comparative samples.

From the above results, it was found that the invention samples had excellent wear resistance and fracture resistance, and as a result, had a long tool life.

INDUSTRIAL APPLICABILITY

Since the coated cutting tool of the present invention has excellent wear resistance and fracture resistance, the tool life can be extended as compared with the conventional cutting tools, and therefore, from such a viewpoint, the coated cutting tool of the present invention has industrial applicability.

REFERENCE SIGNS LIST

1: substrate, 2: lower layer, 3: upper layer, 4: outer layer, 5: coating layer, 6: coated cutting tool.

What is claimed is:
1. A coated cutting tool comprising:
a substrate and a coating layer formed on a surface of the substrate, wherein
the coating layer includes a lower layer and an upper layer in this order from the substrate side toward a surface side of the coating layer,
the lower layer includes one or two or more Ti compound layers composed of a Ti compound of Ti and an element of at least one kind selected from the group consisting of C, N and O,
the upper layer includes an a type α-$Al_2O_3$ layer composed of α-$Al_2O_3$,
an average thickness of the lower layer is 2.0 μm or more and 15.0 μm or less,
an average thickness of the upper layer is 3.5 μm or more and 15.0 μm or less,
in the upper layer, a ratio of a length of Σ3 grain boundaries to a total length of 100% of a total grain boundary is more than 50% and 80% or less, and a ratio of the length of Σ3 grain boundaries to a total length of 100% of coincidence site lattice (CSL) grain boundaries is 70% or more, and
in the upper layer,
a texture coefficient TC(0,0,12) of a (0,0,12) plane of the a type α-$Al_2O_3$ layer represented by a following formula (1) is 8.0 or more and 8.9 or less:

$$TC(0, 0, 12) = \frac{I(0, 0, 12)}{I_0(0, 0, 12)} \left\{ \frac{1}{9} \sum \frac{I(h, k, l)}{I_0(h, k, l)} \right\}^{-1} \quad (1)$$

(in the formula (1), I(h,k,l) is a peak intensity obtained by X-ray diffraction measured on an (h,k,l) plane of the a type α-$Al_2O_3$ layer, $I_0$(h,k,l) is a standard diffraction intensity of the (h,k,l) plane of α-$Al_2O_3$ according to JCPDS card number 10-0173, and (h,k,l) represents nine crystal planes: (0,1,2), (1,0,4), (1,1,3), (0,2,4), (1,1,6), (2,1,4), (3,0,0), (0,2,10), and (0,0,12)).

2. The coated cutting tool according to claim 1, wherein the ratio of the length of the Σ3 grain boundaries to the total length of 100% of the CSL grain boundaries is 80% or more and 99% or less.

3. The coated cutting tool according to claim 2, wherein in the upper layer, a ratio $[d_s/d_u]$ of an average grain size $d_s$ at a position of 0.5 μm from the surface side of the coating layer toward the lower layer side to an average grain size $d_u$ at a position of 2.5 μm from the lower layer side toward a surface of the coating layer is 1.0 or more and 1.7 or less.

4. The coated cutting tool according to claim 2, wherein
the coating layer includes an outer layer on an opposite side of the upper layer to the substrate side,
the outer layer includes a Ti compound layer composed of a Ti compound consisting of Ti and an element of at least one kind selected from the group consisting of C, N and O, and
an average thickness of the outer layer is 0.3 μm or more and 4.0 μm or less.

5. The coated cutting tool according to claim 2, wherein an average thickness of the entire coating layer is 5.5 μm or more and 25.0 μm or less.

6. The coated cutting tool according to claim 3, wherein the $d_u$ is 0.5 μm or more and 1.4 μm or less, and the $d_s$ is 0.6 μm or more and 1.5 μm or less.

7. The coated cutting tool according to claim 3, wherein
the coating layer includes an outer layer on an opposite side of the upper layer to the substrate side,
the outer layer includes a Ti compound layer composed of a Ti compound consisting of Ti and an element of at least one kind selected from the group consisting of C, N and O, and
an average thickness of the outer layer is 0.3 μm or more and 4.0 μm or less.

8. The coated cutting tool according to claim 3, wherein an average thickness of the entire coating layer is 5.5 um or more and 25.0 μm or less.

9. The coated cutting tool according to claim 6, wherein
the coating layer includes an outer layer on an opposite side of the upper layer to the substrate side,
the outer layer includes a Ti compound layer composed of a Ti compound consisting of Ti and an element of at least one kind selected from the group consisting of C, N and O, and
an average thickness of the outer layer is 0.3 μm or more and 4.0 μm or less.

10. The coated cutting tool according to claim 1, wherein in the upper layer, a ratio $[d_s/d_u]$ of an average grain size $d_s$ at a position of 0.5 μm from the surface side of the coating layer toward the lower layer side to an average grain size $d_u$ at a position of 2.5 μm from the lower layer side toward a surface of the coating layer is 1.0 or more and 1.7 or less.

11. The coated cutting tool according to claim 10, wherein the $d_u$ is 0.5 μm or more and 1.4 μm or less, and the $d_s$ is 0.6 μm or more and 1.5 μm or less.

12. The coated cutting tool according to claim 10, wherein
the coating layer includes an outer layer on an opposite side of the upper layer to the substrate side,
the outer layer includes a Ti compound layer composed of a Ti compound consisting of Ti and an element of at least one kind selected from the group consisting of C, N and O, and
an average thickness of the outer layer is 0.3 μm or more and 4.0 μm or less.

13. The coated cutting tool according to claim 10, wherein an average thickness of the entire coating layer is 5.5 μm or more and 25.0 μm or less.

14. The coated cutting tool according to claim 11, wherein
the coating layer includes an outer layer on an opposite side of the upper layer to the substrate side,
the outer layer includes a Ti compound layer composed of a Ti compound consisting of Ti and an element of at least one kind selected from the group consisting of C, N and O, and
an average thickness of the outer layer is 0.3 μm or more and 4.0 μm or less.

15. The coated cutting tool according to claim 11, wherein an average thickness of the entire coating layer is 5.5 μm or more and 25.0 μm or less.

16. The coated cutting tool according to claim 1, wherein
the coating layer includes an outer layer on an opposite side of the upper layer to the substrate side,
the outer layer includes a Ti compound layer composed of a Ti compound consisting of Ti and an element of at least one kind selected from the group consisting of C, N and O, and
an average thickness of the outer layer is 0.3 μm or more and 4.0 μm or less.

17. The coated cutting tool according to claim 16, wherein an average thickness of the entire coating layer is 5.5 μm or more and 25.0 μm or less.

18. The coated cutting tool according to claim 1, wherein an average thickness of the entire coating layer is 5.5 μm or more and 25.0 μm or less.

19. The coated cutting tool according to claim 1, wherein the Ti compound layer contained in the lower layer is at least one selected from the group consisting of a TiN layer composed of TiN, a TiC layer composed of TiC, a TiCN layer composed of TiCN, a TiCO layer composed of TiCO, and a TiCNO layer composed of TiCNO.

20. The coated cutting tool according to claim 1, wherein the substrate is any of a cemented carbide, a cermet, a ceramic, or a cubic boron nitride sintered body.

* * * * *